United States Patent [19]
Berger

[11] 4,366,455
[45] Dec. 28, 1982

[54] SWITCHED-CAPACITY AMPLIFIER, SWITCHED-CAPACITY FILTER AND CHARGE-TRANSFER FILTER COMPRISING SUCH AN AMPLIFIER

[75] Inventor: Jean L. Berger, Paris, France
[73] Assignee: Thomson-CSF, Paris, France
[21] Appl. No.: 204,177
[22] Filed: Nov. 5, 1980

[30] Foreign Application Priority Data
Nov. 9, 1979 [FR] France .................. 79 27713

[51] Int. Cl.³ .............. H03H 11/04; H03H 17/06; H03H 19/00
[52] U.S. Cl. .................. 333/165; 333/173; 357/51
[58] Field of Search .............. 333/167, 165, 173; 357/24, 40–46, 51; 330/7; 328/167, 151

[56] References Cited
U.S. PATENT DOCUMENTS 3,564,146 2/1971 Poscherieder et al. ............ 333/173
4,138,665 2/1979 Eichelberger et al. ............ 330/7 X

OTHER PUBLICATIONS

Temes et al.–"Compensation for Parasitic Capacitances in Switched–Capacitor Filters", Electronics Letters, vol. 15, No. 13, Jun. 21, 1979; pp. 377–379.
Ohara et al.–"First Monolithic PCM Filter Cuts Cost of Telecomm Systems", Electronic Design, vol. 27, No. 8, Apr. 12, 1979; pp. 130–135.
"The ABCs of Switched–Capacitor Filters", Electronic Design, vol. 27, No. 8, Apr. 12, 1979; pp. 132–133.

*Primary Examiner*—Marvin L. Nussbaum
*Attorney, Agent, or Firm*—Roland Plottel

[57] ABSTRACT

A switched-capacity amplifier formed from integrated capacities has undesirable parasitic capacities that are large and variable on only one terminal of each of the capacities. A voltage-follower stage is connected to this terminal of each of the capacities (except those capacities which are grounded) to offset the parasitic capacity. The amplifier is also connected in a switched-capacity filter and a charge-transfer filter.

8 Claims, 4 Drawing Figures

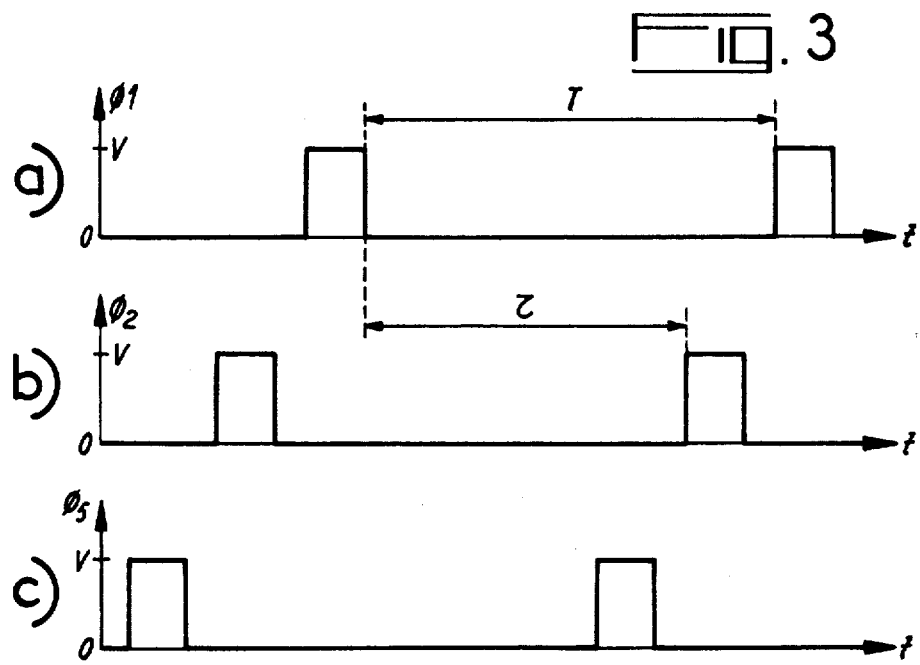
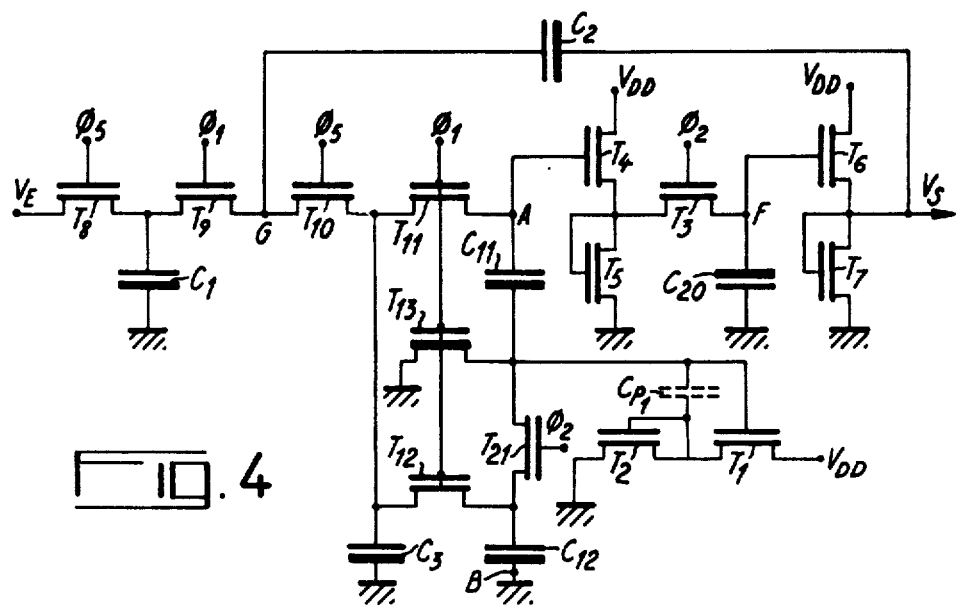

SWITCHED-CAPACITY AMPLIFIER, SWITCHED-CAPACITY FILTER AND CHARGE-TRANSFER FILTER COMPRISING SUCH AN AMPLIFIER

BACKGROUND OF THE INVENTION

The present invention relates to a switched-capacity amplifier.

It also relates to switched-capacity filters and to charge-transfer filters comprising such an amplifier.

An amplifier is known which comprises essentially n capacities periodically switched in parallel and in series; the same voltage charges simultaneously the n capacities which are switched in parallel; an amplified voltage is obtained between the end terminals A and B of the n capacities which are switched in series. The periodic switching of the n capacities in parallel and in series is achieved by means of MOS transistors operating as switches. Finally, the n capacities and the transistors are integrated on the same semiconductor substrate which is generally silicon.

The capacities are formed by a technology which comprises a layer of silica covering the substrate and in which are integrated two layers of polycrystalline silicon disposed parallel to the substrate. On the silica layer is deposited a layer of aluminium comprising two parts insulated from each other and each plate of the integrated capacity is formed by a part of the aluminium layer connected to one of the polycrystalline silicon layers.

The problem which arises is that each integrated capacity C comprises a parasite capacity between each of its plates and the substrate. One of the parasite capacities $C_{P2}$ is fixed and small in value but the other parasite capacity $C_{P1}$ has a high value proportional to the value of the integrated capacity.

The parasite capacities $C_{P1}$ cause reduction in the gain on the known switched-capacity amplifier. Moreover, when this amplifier is used as a differential amplifier, the parasite capacities $C_{P1}$ cause a considerable increase of the common mode.

It is known to provide compensation for the parasite capacities in the case of a differential amplifier comprising two capacities to be switched. This compensation abolishes the common mode but not the reduction in gain due to the parasite capacities $C_{P1}$. Finally, this compensation has the major disadvantage of being only applicable to a given type of amplifier.

It is known from the article appearing in the review Electronics Letters of June 21, 1979, volume 15, No. 13, pages 377 and 378, how to offset simply and efficiently the parasite capacities $C_{P1}$ of the integrated capacities. A constant potential difference must be maintained on the plates of the parasite capacities $C_{P1}$ so as to eliminate any charge or discharge of these capacities during operation. For that, a voltage-follower stage is connected between each terminal $B_1$ of the integrated capacity, which is connected to the plate of the capacity comprising the lower layer of polycrystalline silicon on which $C_{P1}$ appears, and a diffused zone of a type opposite that of the substrate which is disposed at the silica-silicon interface facing the polycrystalline silicon layers.

SUMMARY OF THE INVENTION

The switched-capacity amplifier according to the present invention comprises a voltage-follower stage between the terminal $B_1$ of each integrated capacity and a diffused zone in the substrate. Only the integrated capacities whose terminal $B_1$ is connected to ground do not comprise a follower stage and a diffused zone.

The present invention eliminates first and foremost the parasite defects of capacities $C_{P1}$ in a simple and efficient way. The gain of the amplifiers is increased. Thus, for an amplifier comprising three capacities to be switched, a gain very close to 3 is now obtained.

The common mode of the known differential switched-capacity amplifiers is also practically abolished.

The present invention also presents the advantage of allowing the parasite capacities $C_{P1}$ of the known amplifiers to be offset, whether they are differential or not, and whatever the number of capacities to be switched.

DESCRIPTION OF THE DRAWINGS

Other aims, characteristics and results of the invention will become clear from the following description, given by way of non-limiting example and illustrated by the accompanying figures which represent:

FIGS. 3a, b and c phase diagrams of signals able to be applied to a switched-capacity amplifier and filter in accordance with the present invention FIG. 4, a switched-capacity filter in accordance with the present invention In the different figures, the same reference numbers designate the same elements but, for the sake of clarity, the sizes and proportions of the different elements have not been respected.

DESCRIPTION OF THE PREFERRED EMBODIMENT

Figure 1:
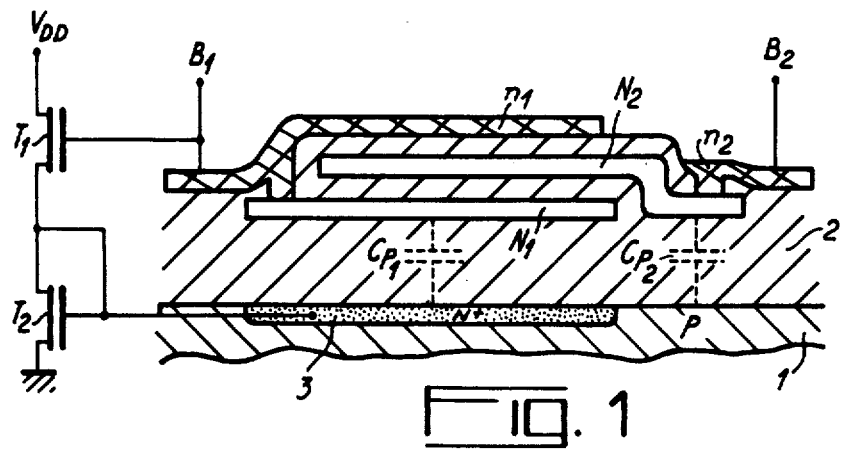
FIG. 1, a sectional view of an integrated capacity with counterbalancing of the parasite capacity $C_{P1}$.

FIG. 1 shows a sectional view of an integrated capacity with compensation for the parasite capacity $C_{P1}$. As was seen above, the capacity is formed by a technology which comprises a silica layer 2 covering the semiconductor substrate 1 which is generally silicon, of type P in the example. Two levels of polycrystalline silicon $N_1$ and $N_2$ are integrated in the layer of silica and disposed parallel to the substrate. On the silica layer is deposited a layer of aluminium comprising two parts n1 and n2 insulated from each other by the silica. Each plate of the integrated capacity is formed by part of the aluminium layer connected to one of the polycrystalline silicon layers. We will call $B_1$ the terminal of the integrated capacity which is connected to the plate of the capacity comprising the lower level $N_1$ of polycrystalline silicon and $B_2$ the terminal of the integrated capacity which is connected to the plate of the capacity comprising the upper layer $N_2$ of polycrystalline silicon.

The silica layers separating the different metalizations are thin compared to the silica layer separating them from the substrate. The presence of the semiconductor substrate 1, carrying the oxide layer 2, which is generally taken as reference for the potentials, introduces a parasite capacity $C_{P1}$ and $C_{P2}$ on the terminals $B_1$ and $B_2$ of each integrated capacity. These parasite capacities are shown with a broken line in FIG. 1.

The values of $C_{P1}$ and $C_{P2}$ are different. The value of $C_{P1}$ is high and proportional to the value of the integrated capacity C. The value of $C_{P2}$ is fixed and may be made smaller by modifying the design of the alumunum layer $n_2$. The parasite capacity $C_{P1}$ is therefore particularly troublesome. This capacity is compensated for by maintaining a constant potential difference on its plates so as to eliminate any charge or discharge of this capacity during operation. For that, there is formed at the silica-silicon interface, facing the layers of polycrystalline silicon $N_1$ and $N_2$, a diffused zone 3 of type opposite that of the substrate. In the example shown in FIG. 1, the diffused zone is of type N+ for the substrate is of type P. A voltage-follower stage is connected between terminal $B_1$ and the diffused zone 3.

This voltage-follower stage is formed by two MOS transistors $T_1$ and $T_2$ which are connected in series between a bias voltage $V_{DD}$ and ground. Terminal $B_1$ of the integrated capacity is connected to the grid of transistor $T_1$, connected to $V_{DD}$, whereas the diffused zone 3 and the electrode common to $T_1$ and $T_2$ are connected to the grid of transistor $T_2$ connected to ground.

This voltage-follower stage is generally integrated in the semiconductor substrate 1. The circuit shown in FIG. 1 allows the parasite capacity $C_{P1}$ to be compensated for; it would also be possible to compensate for parasite capacity $C_{P2}$ but that is generally not worth while because of its very small value.

Figure 2:
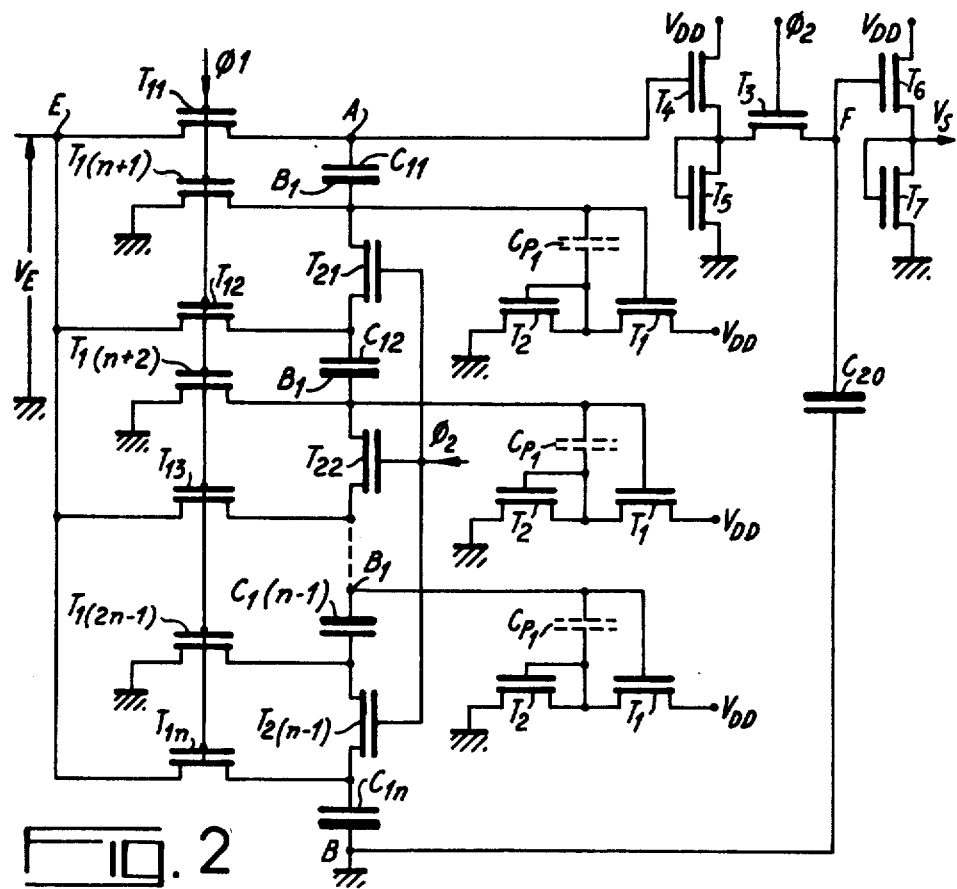
FIG. 2, a switched-capacity amplifier in accordance with the present invention

FIG. 2 shows a switched-capacity amplifier in accordance with the present invention.

Given $C_{11}$, $C_{12}$... $C_{1n}$, the n capacities to be periodically switched from parallel to series and vice versa.

(n−1) MOS transistors $T_{21}$ to $T_{2(n−1)}$ are connected by their drains and their sources between the terminals of two successive capacities, only the two endmost terminals are left free: terminal A of capacity $C_{11}$ and terminal B of capacity $C_{1n}$.

n MOS transistors, $T_{11}$ to $T_{1n}$, are connected by their drains and their sources between one of the terminals of each capacity, among which the endmost terminal A, and the input E where a voltage $V_E$ is applied.

(n−1) MOS transistors $T_{1(n+1)}$ to $T_{1(2n−1)}$ are connected by their drains and their sources between the other terminal of each capacity and ground, except for terminal B which is connected directly to ground.

The MOS transistors are controlled by two periodic signals $\phi_1$ and $\phi_2$ applied respectively to the grids of transistors $T_{11}$ to $T_{1(2n−1)}$, belonging to a first group of transistors $G_1$, and $T_{21}$ to $T_{2(n−1)}$, belonging to a second group of transistors $G_2$.

FIGS. 3a and 3b show the phase diagrams of the periodic signals $\phi_1$ and $\phi_2$.

The amplitude of potentials $\phi_1$ and $\phi_2$ varies, in volts, between 0 and V, substantially as square waves, with a period T. The potentials $\phi_1$ and $\phi_2$ are never at V at the same time and the passage of $\phi_1$ from V to zero is separated from the passage of $\phi_2$ from zero to V by a non-zero interval of time $\tau$.

When the signal $\phi_1$ assumes the value V, transistors $T_{11}$ to $T_{1(2n−1)}$ of the first group conduct. The voltage $V_E$ then charges the n capacities, in parallel, through transistors to $T_{11}$ to $T_{1n}$, while one terminal of these capacities is maintained at ground by the transistors $T_{1(n+1)}$ to $T_{1(2n−1)}$.

When the signal $\phi_1$ assumes the value zero which disables the MOS transistors of the first group, the n capacities are then charged to voltage $V_E$.

After a non-zero time interval $\tau$, so that the transistors of the two groups are not simultaneously enabled, signal $\phi_2$ passes to V and enables the transistors $T_{21}$ to $T_{2(n−1)}$ of the second group. The n capacities are then in series and the voltage between point A and ground equals $n.V_E$.

The first group of MOS transistors ensures that the parallel switching of the n capacities and the second group their series switching.

In FIG. 2 there is shown by a thick line the plate of each integrated capacity C which is connected to terminal $B_1$ and with a thin line the plate of each integrated capacity C which is connected to terminal $B_2$.

Only capacity $C_{1n}$, whose terminal $B_1$ is connected to ground does not comprise a follower stage and a diffused zone. All the other capacities of amplifier $C_{11}$ to $C_{1(n−1)}$ comprise a diffused zone 3 and a voltage-follower stage between terminal $B_1$ and the diffused zone 3, which is similar to the one shown in FIG. 1. In FIG. 2 the follower stages are shown at the terminals of the parasite capacities $C_{P1}$ which are shown symbolically with a broken line.

The output stage of the amplifier comprises a first voltage-follower stage connected to the point A. This voltage follower stage is formed from two MOS transistors $T_4$ and $T_5$ in series between the bias voltage $V_{DD}$ and ground. Point A is connected to the grid of $T_4$, which is connected to $V_{DD}$, whereas the output of this follower stage is formed by the terminal common to $T_4$ and $T_5$ to which the grid of $T_5$ is connected.

At the output of the follower stage there is connected an MOS transistor $T_3$ receiving on its grid the signal $\phi_2$ and allowing the transfer of the amplified voltage $n.V_E$ when $\phi_2$ is at the high level.

At the output of $T_3$ at point F is connected a holding capacity $C_{20}$, also connected to point B.

Finally, in series with $T_3$ is connected a second follower stage similar to the first one and formed from two MOS transistors $T_6$ and $T_7$. This stage provides the output voltage $V_S$.

Like the capacities $C_{11}$ to $C_n$, capacity $C_{20}$ is integrated in the semiconductor substrate. Its terminal $B_1$ is connected to point F. Thus the parasite capacity $C_{P1}$ is added to the value of $C_{20}$ which allows integration on the semiconductor substrate of a capacity $C_{20}$ of a lower value.

The amplifier shown in FIG. 2 may also operate as a differential amplifier. For that the MOS transistors $T_{1(n+1)}$ to $T_{1(2n−1)}$ must no longer be connected to ground but to a second input of amplifier E'. Further point B is no longer connected to ground but to an MOS transistor $T_{1(2n)}$ connected to the second input E' of the amplifier. In this case, it is necessary to compensate for the parasite capacity $C_{P1}$ on the terminal $B_1$ of capacity $C_{1n}$. A diffusion 3 is then provided on this capacity and a follower stage is connected across the terminals of its parasite capacity $C_{P1}$. A transistor $T_{2n}$ is generally connected between point B and a reference voltage $V_R$. This transistor receives on its grid signal $\phi_2$ and allows adjustment of a possible offset voltage.

The switched-capacity amplifier of the present invention may be used in switched-capacity filters and in charge-transfer filters.

Switched-capacity filters have been described, in particular, in "Proceedings of the Institute of Electrical and Electronics Engineers" volume SC12-No. 6-December 1977-pages 592 to 608 and "International Symposium on Circuits and Systems Proceedings"-April 1977-pages 525 to 529.

Switched-capacity filters comprise essentially a filtering cell and an amplifier. The filtering cell, which is integrated, has the same properties as a conventional filtering cell, formed from resistors and capacities, but it only comprises capacities and MOS transistors. The resistors are replaced by a combination of MOS transistors and capacities, which allows particularly the space taken up thereby to be reduced and a greater temperature stability and better linearity to be obtained.

The switched-capacity amplifier of the present invention uses the same technology as the filtering cell since it comprises solely capacities and MOS transistors, it can therefore be easily integrated therewith.

In FIG. 4, a switched-capacity filter of the low-pass type is taken as an example.

The filtering cell is formed by two resistors in series with the input of the amplifier and by a capacity between the input of the amplifier and ground. Further, a capacity connected between the output of the amplifier and the common point between the resistors provides looping of the filter.

In FIG. 4, the first resistor is formed by the MOS transistors $T_8$ and $T_9$ in series and by a capacity $C_1$ between the point common to these transistors and ground. The second resistor is formed by the MOS transistor $T_{10}$ which is connected to transistor $T_9$ and by a capacity $C_3$ connected between the other terminal of $T_{10}$ and ground. This second resistor also comprises transistors $T_{11}$ and $T_{12}$ which belong to a switched-capacity amplifier similar to the one shown in FIG. 2 but which comprises for example only two capacities to be switched $C_{11}$ and $C_{12}$ between point A and point B. In the example shown in FIG. 4, the capacity of the filtering cell which is connected between the input of the amplifier and ground merges with the two capacities to be switched $C_{11}$ and $C_{12}$ of the amplifier. Capacity $C_2$ which is connected between the output of the amplifier and point G common to transistors $T_9$ and $T_{10}$ ensures looping of the filter.

Terminals $B_1$ of capacities $C_1$, $C_3$ and $C_{12}$ are connected to ground and so it is not necessary to offset the parasite capacities $C_{P1}$ which appear at these terminals. Only the first capacity to be switched $C_{11}$ requires its parasite capacity $C_{P1}$ to be offset and comprises, as shown in FIG. 1, a voltage-follower stage at the terminals of its parasite capacity $C_{P1}$, i.e. between terminal $B_1$ and a diffused zone 3.

Insofar as the looping capacity $C_2$ is concerned, its terminal $B_1$ is connected to the output of the amplifier for this output is at a low impedance and the parasite capacity $C_{P1}$ due to $C_2$ does not cause disturbance thereto. Transistors $T_8$ and $T_{10}$ receive a periodic signal $\phi_5$, transistor $T_9$ and transistors $T_{11}$, $T_{12}$, $T_{13}$ receive signal $\phi_1$ and transistors $T_3$ and $T_{21}$ receive the signal $\phi_2$.

The signal $\phi_5$ is a signal similar to $\phi_1$ and $\phi_2$, which varies, substantially as a square wave, between a zero level and a level V, with a period T. Signal $\phi_5$ is at level V whereas $\phi_1$ and $\phi_2$ are at the low level, signal $\phi_5$ comes to the zero level before $\phi_2$ goes to level V.

The frequency response of the filter shown in FIG. 4 is similar to that of a filter of the second order but comprises an additional pole at the frequency half the sampling frequency which does not affect the behavior at low frequencies.

The amplifier of the present invention may also be used in a charge-transfer filter in its differential amplifier version. It then serves to work out the difference of the voltages obtained from the charges collected on the cut electrodes of the filter. The differential amplifier of the present invention is well-adapted to this kind of application for the periodic signals $\phi_1$ and $\phi_2$ required for its operation may be merged with signals used in the operation of the charge-transfer device. Furthermore, this amplifier processes sampled signals and it is sampled signals which arrive from the reading means of the charge-transfer device.

What is claimed is:

1. A circuit having a plurality of integrated capacities comprising
   (a) a semiconductor substrate of one conductivity type;
   (b) a layer of silica on said substrate;
   (c) each of said capacities comprising,
      (i) an upper and a lower layer of polycrystalline silicon integrated in said silica and parallel to the substrate;
      (ii) two layers of aluminum formed on the silica and insulated from each other, and each being connected to one of the polycrystalline layers respectively; and the plates of each integrated capacity being formed by an aluminum layer and its respective polycrystalline silicon layer; and a terminal, designated B1, being associated with the plate of the capacity comprising the lower layer of polycrystalline silicon;
   (d) one of said integrated capacities having its B1 terminal connected to ground;
   (e) a zone of opposite conductivity type at the semiconductor silica interface facing said polycrystalline silicon layers of at least another of said integrated capacities; and
   (f) a voltage follower stage having one control terminal connected to said B1 terminal of said other integrated capacity and the other control terminal connected to said zone of said other integrated capacity; whereby said circuit is a switched capacity amplifier.

2. The circuit according to claim 1, wherein each voltage-follower stage is formed by MOS transistors in series between a bias voltage and ground, the terminal B1 of the integrated capacity being connected to the control terminal of the transistor connected to the bias voltage; and said zone and electrode common to the two transistors being connected to the control terminal of the transistor connected to ground.

3. The circuit according to claim 1, wherein each voltage-follower stage is integrated in the same semiconductor substrate as the capacities.

4. The circuit according to claim 1, comprising an output stage connected to output terminals A and B of the amplifier, said output stage being formed by a first voltage-follower stage (T4-T5) connected to terminal A in series with an MOS transistor (T3), having a control terminal and receiving thereon a periodic signal $\phi_2$, said transistor being followed by a second voltage-follower stage (T6-T7), and a holding capacity (C20) connected between terminal B and a joint common to the second follower stage (T6-T7) and to said MOS transistor (T3), the terminal B1 of said capacity being connected to said common point.

5. A switched capacity filter having a plurality of integrated capacities comprising
   (a) a semiconductor substrate of one conductivity type;
   (b) a layer of silica on said substrate;
   (c) each of said capacities comprising, (i) an upper and a lower layer of polycrystalline silicon integrated in said silica and parallel to the substrate;

(ii) two layers of aluminum formed on the silica and insulated from each other, and each being connected to one of the polycrystalline layers respectively; and the plates of each integrated capacity being formed by an aluminum layer and its respective polycrystalline silicon layer; and a terminal, designated B1, being associated with the plate of the capacity comprising the lower layer of polycrystalline silicon;

(d) one of said integrated capacities having its B1 terminal connected to ground;

(e) a zone of opposite conductivity type at the semiconductor silica interface facing said polycrystalline silicon layers of at least another of said integrated capacities;

(f) a voltage follower stage having one control terminal connected to said B1 terminal of said other integrated capacity and the other control terminal connected to said zone of said other integrated capacity; whereby said circuit is a switched capacity amplifier; and (g) further comprising a switched capacity filtering cell formed from capacities and MOS transistors connected between said terminal B1 of said at least one other integrated capacity and the B1 terminal connected to ground; whereby said circuit forms with said amplifier a switched-capacity filter.

6. The filter according to claim 5, wherein capacities of the switched-capacity amplifier merge with a capacity of the filtering cell, said filtering cell comprising two resistances in series, one being formed by two MOS transistors (T8,T9) in series and an integrated capacity (C1) between their common point and ground; the other by an MOS transistor (T10) in series with transistors (T11,T12) of the amplifier and an integrated capacity (C5) between their common point and ground; the terminals B1 of said two integrated capacities (C1,C5) being connected to ground; the filtering cell also comprising a looping integrated capacity (C2) between an output (V5) of the amplifier and the point common (G) of the resistors; terminal B1 of this looping integrated capacity being connected to the output of the amplifier.

7. A change transfer filter having a plurality of integrated capacities comprising (a) a semiconductor substrate of one conductivity type;

(b) a layer of silica on said substrate;

(c) each of said capacities comprising, (i) an upper and a lower layer of polycrystalline silicon integrated in said silica and parallel to the substrate;

(ii) two layers of aluminum formed on the silica and insulated from each other, and each being connected to one of the polycrystalline layers respectively; and the plates of each integrated capacity being formed by an aluminum layer and its respective polycrystalline silicon layer; and a terminal, designated B1, being associated with the plate of the capacity comprising the lower layer of polycrystalline silicon;

(d) one of said integrated capacities having its B1 terminal connected to ground;

(e) a zone of opposite conductivity type at the semiconductor silica interface facing said polycrystalline silicon layers of at least another of said integrated capacities;

(f) a voltage follower stage having one control terminal connected to said B1 terminal of said other integrated capacity and the other control terminal connected to said zone of said other integrated capacity; whereby said circuit is a switched capacity amplifier; and (g) further comprising cut electrodes and a differential amplifier receiving voltages obtained from charges taken from said cut electrodes whereby a charge transfer filter is formed.

8. A circuit having a plurality of integrated capacities comprising (a) a semiconductor substrate of one conductivity type;

(b) a layer of silica on said substrate;

(c) each of said capacities comprising, (i) an upper and lower layer of polycrystalline silicon integrated in said silica and parallel to the substrate;

(ii) two layers of aluminum formed on the silica and insulated from each other, and each being connected to one of the polycrystalline layers respectively; and the plates of each integrated capacity being formed by an aluminum layer and its respective polycrystalline silicon layer; and a terminal, designated B1, being associated with the plate of the capacity comprising the lower layer of polycrystalline silicon;

(d) a zone of opposite conductivity type at the semiconductor silica interface facing said polycrystalline silicon layers of at least another of said integrated capacities; and (e) a voltage follower stage having one control terminal connected to said B1 terminal of each integrated capacity and the other control terminal connected to said zone of each integrated capacity, whereby said circuit is a differential switched capacity amplifier.

* * * * *